United States Patent
Harada et al.

(10) Patent No.: US 9,437,669 B2
(45) Date of Patent: Sep. 6, 2016

(54) SEMICONDUCTOR DEVICE

(71) Applicant: SEIKO INSTRUMENTS INC., Chiba-shi, Chiba (JP)

(72) Inventors: Hirofumi Harada, Chiba (JP); Masaru Akino, Chiba (JP)

(73) Assignee: SII SEMICONDUCTOR CORPORATION (JP)

(*) Notice: Subject to any disclaimer, the term of this patent is extended or adjusted under 35 U.S.C. 154(b) by 0 days.

(21) Appl. No.: 14/617,572

(22) Filed: Feb. 9, 2015

(65) Prior Publication Data
US 2015/0228655 A1 Aug. 13, 2015

(30) Foreign Application Priority Data

Feb. 13, 2014 (JP) ................. 2014-025808

(51) Int. Cl.
*H01L 27/10* (2006.01)
*H01L 49/02* (2006.01)
*H01L 27/08* (2006.01)

(52) U.S. Cl.
CPC .......... *H01L 28/20* (2013.01); *H01L 27/0802* (2013.01)

(58) Field of Classification Search
CPC ............. H01L 28/20; H01L 27/0802; H01L 27/0288; H01L 27/0647; H01L 27/101; H01L 27/0629

USPC ........ 257/489, 536, 537, 656; 438/171, 190, 438/210, 238, 330, 382
See application file for complete search history.

(56) References Cited

U.S. PATENT DOCUMENTS

| 5,759,870 A * | 6/1998 | Yun ............. B81C 1/00047 438/445 |
| 2001/0019901 A1* | 9/2001 | Sano .............. H01L 21/3105 438/769 |
| 2009/0160017 A1* | 6/2009 | Ito .............. H01L 21/02142 257/528 |
| 2011/0073959 A1* | 3/2011 | Frohberg .......... H01L 21/76801 257/401 |
| 2012/0228719 A1* | 9/2012 | Harada ............. H01L 27/0629 257/381 |

OTHER PUBLICATIONS

Patent Abstracts of Japan, Publication No. 09-321229, Publication Date Dec. 12, 1997.

* cited by examiner

*Primary Examiner* — Jarrett Stark
*Assistant Examiner* — Shahed Ahmed
(74) *Attorney, Agent, or Firm* — Adams & Wilks

(57) ABSTRACT

A semiconductor resistor circuit has resistor elements of a polycrystalline silicon thin film formed on an insulating film deposited on a semiconductor substrate. A high stress insulating film is formed on and covers the resistor elements and the insulating film exposed between the resistor elements. Metal wirings cover upper portions of the resistor elements. The high stress insulating film has a membrane stress that is higher than that of the metal wirings.

10 Claims, 8 Drawing Sheets

SEMICONDUCTOR DEVICE

BACKGROUND OF THE INVENTION

1. Field of the Invention

The present invention relates to a semiconductor device. More particularly, the present invention relates to a resistor circuit to be used in a semiconductor device.

2. Description of the Related Art

Resistors to be used in a semiconductor device or a semiconductor integrated circuit include a diffused resistor in which impurities are implanted into a monocrystalline silicon semiconductor substrate, which have a conductive type opposite to that of the semiconductor substrate, and a polycrystalline silicon resistor formed of polycrystalline silicon having impurities implanted thereinto.

FIG. 2A is a plan view illustrating a related-art resistor circuit in which resistor elements formed of polycrystalline silicon are two-dimensionally arranged. FIG. 2B is a sectional view taken along the line A-A' of FIG. 2A.

A high concentration impurity region 6 and a low concentration impurity region 7 are formed in a polycrystalline silicon film forming the resistor elements. A resistance value of the resistor element depends on a resistivity, a length, and a width of the low concentration impurity region 7, and the resistivity of the low concentration impurity region 7 is determined by an impurity concentration of the low concentration impurity region 7 having a high resistance. The high concentration impurity region 6 is used for ohmic connection with a metal wiring.

An intermediate insulating film 8 is formed on the resistor elements, and electrical connection of the respective resistor elements is made by metal wirings 10 via contact holes 9. The resistor circuit to be used in a semiconductor integrated circuit is formed by connecting the plurality of resistor elements illustrated in FIGS. 2A and 2B in series or in parallel on a surface of the same substrate as, for example, illustrated in FIG. 3 via the metal wirings.

The intermediate insulating film 8 formed on the resistor elements contains boron or phosphorus, and is planarized through heat treatment at 850° C. or higher to reduce a level difference due to the film pattern in the semiconductor integrated circuit. Further, after the metal wirings are formed, a film 11 as a protective film such as a silicon nitride film is formed thereon.

The resistor elements that are laid out to form the resistor circuit have the same shape in plan including a width and a length. This causes the respective resistor elements to equally suffer from variations in shape in an etching process that defines the shape, and resistance ratios can be held constant among the resistor elements.

At that time, when resistance values of the resistor elements and the ratios among the resistor elements are changed in accordance with requirement by the resistor circuit, the changes are realized by connecting in parallel or in series the resistor elements having the same shape as illustrated in FIG. 3. In this case, in order to realize a resistor circuit having resistance values of 4R, 2R, 1R, and 1/2R (R is a resistance value of one resistor element) in FIG. 3, four resistor elements connected in series, two resistor elements connected in series, one resistor element, and two resistor elements connected in parallel are connected. By adjusting the resistance values by resistor groups 201 to 204 including the plurality of resistor elements and forming the resistor circuit of the resistor groups 201 to 204, both of desired resistance ratios and high accuracy of the resistance ratios are attained.

Further, in order to enhance the accuracy of the resistance values, in addition to uniformization of the processed shape, reduction of influence of an ambient voltage and stabilization thereof are necessary. The reason is that, because a polycrystalline silicon thin film is a semiconductor, depletion and accumulation phenomena are caused by an ambient potential to change the resistance value. Means for solving this problem is also included in FIGS. 2A and 2B.

First, with reference to FIG. 2A, by forming the metal wirings over the respective resistor groups of the resistor circuit and applying a predetermined voltage, a voltage around the resistor element is stabilized and the extent of depletion and accumulation with regard to the resistor elements is fixed to a predetermined value. Further, as can be seen in FIG. 2B, the metal wirings over the resistor elements are formed over the respective resistor groups so as to cover the resistor elements via the intermediate insulating film 8.

Next, with regard to the potentials of the metal wirings over the resistor elements, by applying a potential from one terminal of each of the resistor groups, the potential applied is close to the potential of each of the resistor groups, and thus, the influence of the ambient voltage is minimized and the extent of the depletion and the accumulation is minimized.

On the other hand, no special measures are taken with regard to a lower side of the resistor groups in FIGS. 2A and 2B in the semiconductor substrate. Such a method is sometimes adopted that a well region or a polycrystalline silicon electrode is formed on the lower side for each of the resistor groups and a potential thereof is applied from one terminal of each of the resistor groups. An effect of maintaining the accuracy in this method is enhanced more as the voltage applied to the resistor circuit becomes larger (see, for example, Japanese Patent Application Laid-open No. Hei 09-321229).

Manufacture of a resistor element in a related-art semiconductor device has the following problem.

A metal wiring formed on a resistor element, which is formed of polycrystalline silicon, has a membrane stress that is determined by a specific linear expansion coefficient and a formation temperature. Therefore, when a metal wiring is formed with respect to each of the resistor groups, a stress corresponding to an area thereof is applied to the resistor group thereunder, and the resistance value of polycrystalline silicon changes due to a piezoresistance effect. As a result, the resistance values of the respective resistor groups deviate from a desired design value and a balance among the resistance ratios in the resistor circuit is lost.

The stress also varies depending on the kind of the metal. When a film that is liable to shrink due to heat such as a film formed of a high melting point metal is adopted, the influence described above becomes prominent.

Therefore, a related-art resistor circuit in which metal films are separately formed for the respective resistor groups has a problem in that enhancing the accuracy of the resistance ratios is difficult.

SUMMARY OF THE INVENTION

In order to solve the problem described above, the present invention has the following configuration.

That is, there is provided a semiconductor device, including: a semiconductor substrate; a first insulating film that is formed of a silicon oxide film formed on the semiconductor substrate; a plurality of resistor elements that are formed of a polycrystalline silicon thin film formed on the first insulating film, each of the plurality of resistor elements including a low concentration impurity region and a high concentration impurity region; a second insulating film that is formed of a silicon oxide film over the resistor elements; a plurality of metal wirings that are formed so as to cover the low concentration impurity regions of the plurality of resistor elements, one end of each of the plurality of metal wirings being electrically connected to one end of each of the plurality of resistor elements; and a third insulating film that is formed between the plurality of resistor elements and the second insulating film in a region that is larger than a region of the plurality of metal wirings, the third insulating film having one of a compressive stress and a tensile stress that is higher than one of a compressive stress and a tensile stress of each of the plurality of metal wirings.

The semiconductor device further includes the third insulating film also between the first insulating film and the plurality of resistor elements, the third insulating film having one of the compressive stress and the tensile stress that is higher than the one of the compressive stress and the tensile stress of the each of the plurality of metal wirings.

Further, in the semiconductor device, the third insulating film has one of a compressive stress of 500 MPa or more and a tensile stress of 500 MPa or more.

Further, in the semiconductor device, the third insulating film is formed of SiC, SiON, or SiCN.

Further, in the semiconductor device, the third insulating film is a silicon nitride film formed by low pressure CVD.

Further, in the semiconductor device, the third insulating film that is a silicon nitride film has a thickness of 0.15 µm or more.

According to one embodiment of the present invention, a semiconductor integrated circuit including therein the accurate resistor elements, which are not influenced by stresses from the metal wirings, can be provided.

DETAILED DESCRIPTION OF THE INVENTION

Figure 1A:
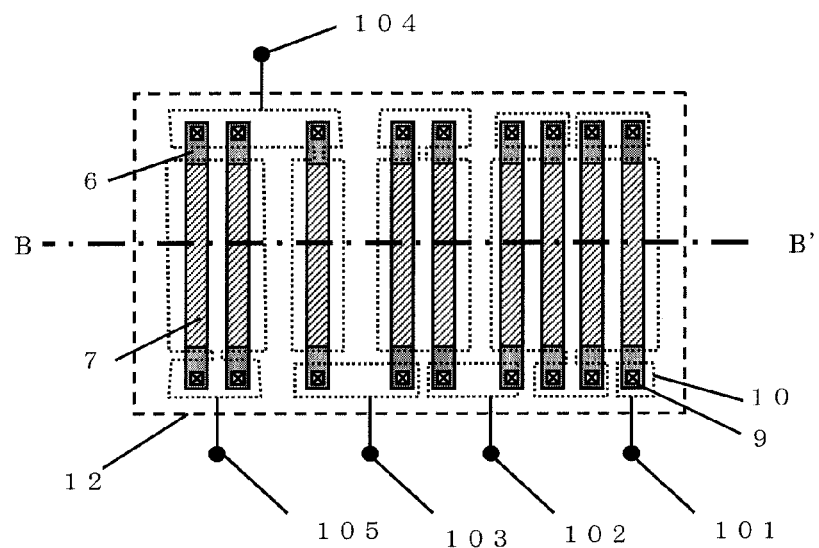
FIGS. 1A and 1B are a schematic plan view and a schematic sectional view illustrating a resistor circuit according to a first embodiment of the present invention.

Embodiments of the present invention are described in the following with reference to the attached drawings. FIG. 1A is a plan view illustrating a resistor circuit to be a semiconductor device according to the present invention, in which resistor elements formed of polycrystalline silicon are two-dimensionally arranged, and FIG. 1B is a sectional view taken along the line B-B' of FIG. 1A.

Figure 3:
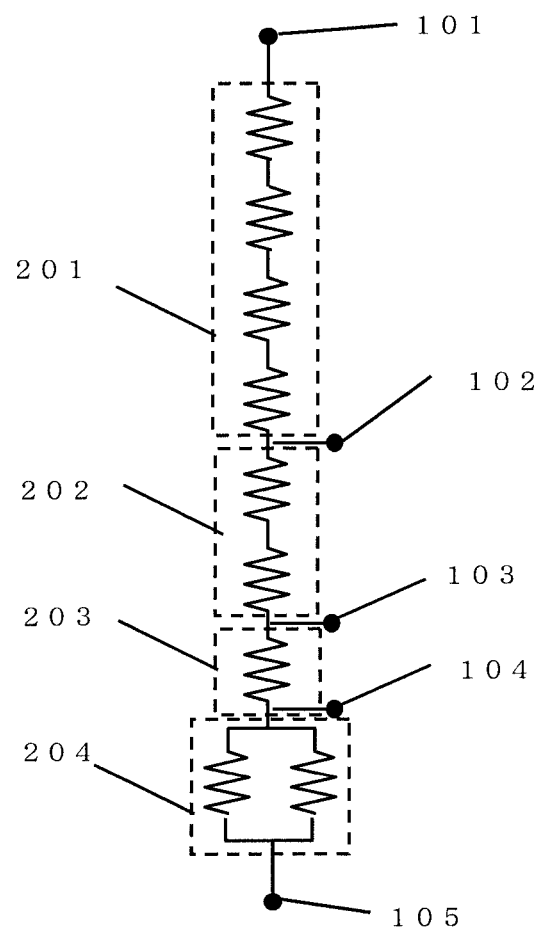
FIG. 3 illustrates an exemplary circuit diagram of a resistor circuit.

Electrical connection among the resistor elements forming the resistor circuit is as illustrated in a circuit diagram of FIG. 3. For example, four of the resistor elements are connected in series between a terminal 101 and a terminal 102.

Figure 1B:
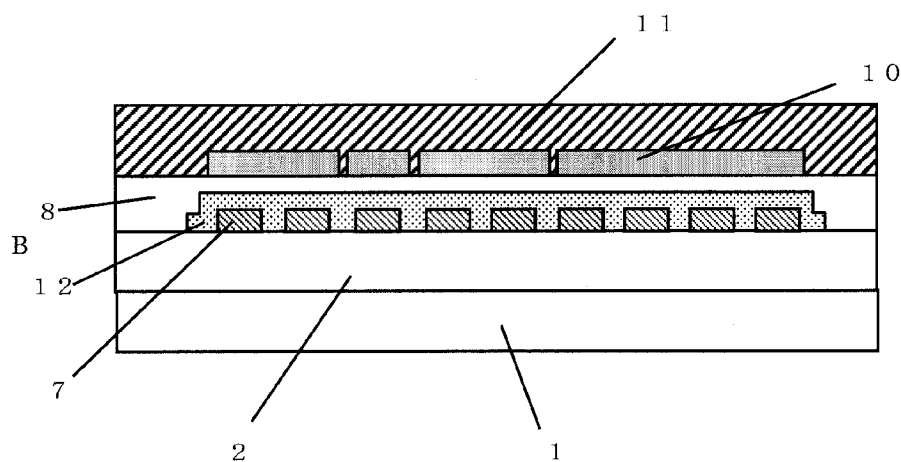
Figure 2A:
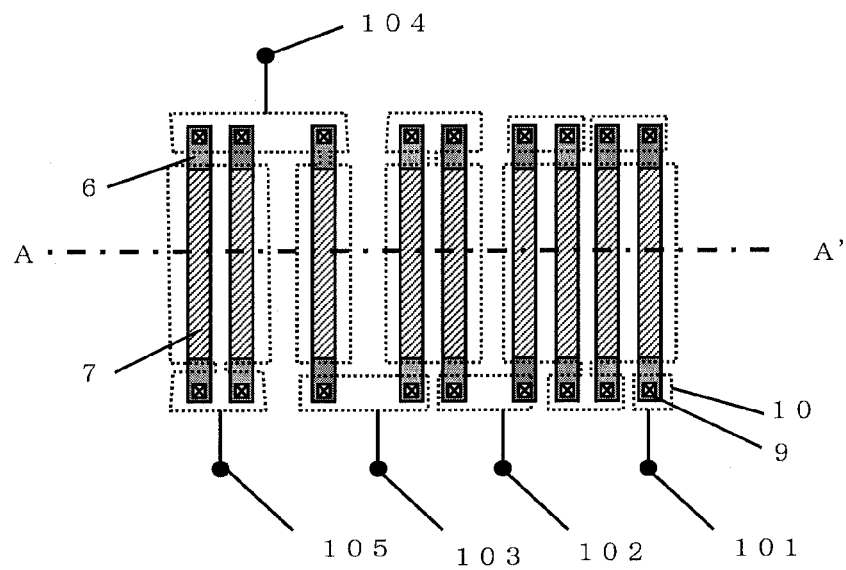
FIGS. 2A and 2B are a schematic plan view and a schematic sectional view illustrating a related-art resistor circuit.
Figure 2B:
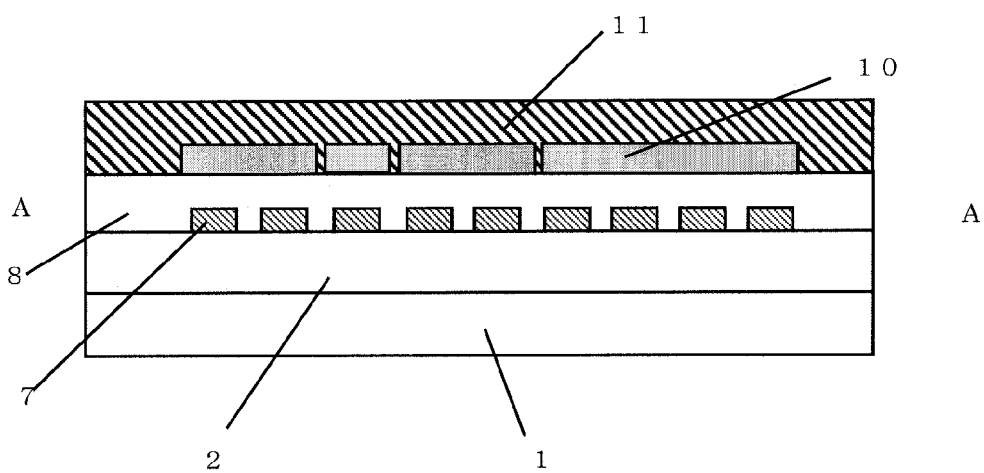

As illustrated in FIG. 1B, the resistor elements forming the resistor circuit are formed of a polycrystalline silicon film that is deposited on a flat thick oxide film 2 on a semiconductor substrate 1. A high stress insulating film 12 is further deposited on the resistor elements and on the exposed surface of the oxide film 2 between the resistor elements so as to sufficiently cover upper surfaces and side surfaces of the resistor elements.

Similarly to the related art, high concentration impurity regions 6 and low concentration impurity regions 7 are formed in polycrystalline silicon forming the resistor elements, a resistance value of the resistor element depends on an impurity concentration, a length, and a width of the low concentration impurity region 7 having a high resistance, and the high concentration impurity region 6 is used for ohmic connection with a metal wiring 10.

An intermediate insulating film 8 is formed on the resistor elements and the insulating film 12. Electrical connection is made by the metal wirings 10 via contact holes 9. In this case, although not illustrated, the contact holes 9 pierce both the intermediate insulating film 8 and the high stress insulating film 12 on the resistor elements, to thereby reach polycrystalline silicon forming the resistor elements. In this manner, electrical connection is made.

Further, similarly to the related art, part of the metal wirings 10 are separately formed correspondingly to a plurality of resistor groups 201 to 204 each formed of a plurality of resistor elements, so as to cover the low concentration impurity regions 7 that determine resistance values of the resistor elements, and, by connecting the metal wiring 10 to a terminal in proximity to the resistor group, a voltage around the resistor elements is stabilized and the accuracy of the resistance ratios among the resistor elements is enhanced.

By the way, when the film forming the metal wirings is Al—Si containing Si, the film has a membrane stress that is determined by a formation temperature, a linear expansion coefficient, and the like, although the membrane stress depends on a formation method, and the membrane stress is generally about 100 MPa. The stress influences the resistor group thereunder via the intermediate insulating film 8 and causes variations in resistance value due to the piezoresistance effect. As described above, metal wirings formed for the respective resistor groups have different areas, and thus, the stress value varies depending on the area. In addition, the resistance ratios among the resistor groups deviate from a predetermined desired design value, and the accuracy of the resistor circuit is deteriorated.

Further, in a fine process, generally, a high-melting-point metal film such as a Ti-based metal film having a barrier effect is stacked as an underlayer of an Al-based wiring, but the high-melting-point metal shrinks due to heat treatment thereafter, and, depending on the conditions, is to have a membrane stress of about 200 to 500 MPa. In that case, the piezoresistance effect described above becomes stronger to act so that the deviation of the resistance ratios of the respective resistor groups increases, and further the accuracy of the resistor circuit is deteriorated.

In order to solve the problem, according to the present invention, by forming the high stress insulating film 12 having a membrane stress that is higher than that of the metal wirings so as to cover all the resistor elements, influence of different membrane stresses of metal wirings having different areas is eliminated and the ambient voltage of the resistor elements is stabilized to realize a resistor circuit with high accuracy.

It is desired that the high stress insulating film 12 have a membrane stress of several hundreds of megapascals or more, and as the high stress insulating film 12, there is given a film of a material of, for example, $Si_3N_4$, SiC, SiON, or SiCN. A single-layer film using one of the above-mentioned films may be used, or, a multilayer film including a plurality of films may be used. In particular, $Si_3N_4$ manufactured by low pressure CVD is highly dense, and a deposition of a film having a thickness of 0.15 moan realize a membrane stress of about 1,000 MPa, and thus, $Si_3N_4$ is preferred according to the present invention from the viewpoint of easiness of formation and compatibility with a semiconductor process. A thermal nitride film can be formed more densely, but has a thickness ceiling when a high stress is sought, and thus, is not preferred according to the present invention.

Next, a method of manufacturing the structure of the resistor circuit illustrated in FIGS. 1A and 1B according to the present invention is described with reference to FIG. 5A to FIG. 6F.

Figure 5A:
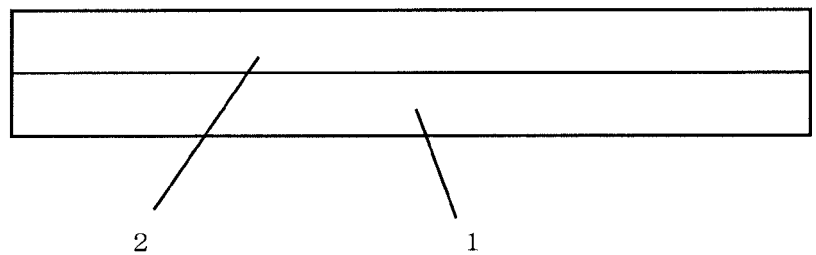
FIGS. 5A to 5C are sectional views illustrating a process flow for manufacturing the resistor circuit according to the first embodiment of the present invention.

First, the semiconductor substrate 1 is prepared. The insulating film 2 such as a thermal oxide film by LOCOS oxidation is formed on the semiconductor substrate 1 (FIG. 5A).

Then, a polycrystalline silicon thin film forming the resistor elements is stacked, and impurities for setting the resistivity of the resistor elements are implanted into the entire polycrystalline silicon film on the semiconductor substrate. The resistivity of the resistor elements is adjusted by the amount of the implanted impurities. As the impurities, N-type phosphorus, arsenic, P-type boron, $BF_2$, or the like is used. Although depending on the desired resistivity, the amount of the implanted impurities is set to be $1 \times 10^{15}$ to $5 \times 10^{19}$ atoms/cm$^3$.

Figure 5B:
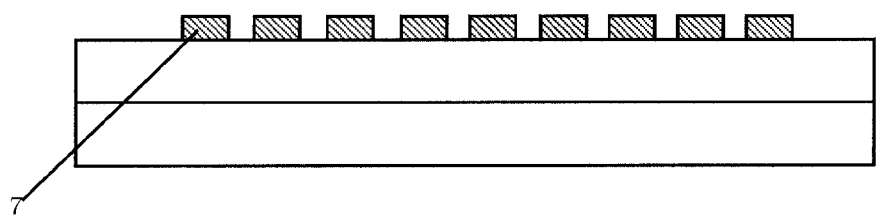

Then, the polycrystalline silicon thin film is processed by dry etching or the like to define the shape of resistor elements 7. At this time, by setting the shape of and the intervals between the respective resistor elements to be the same, even if photopatterning varies and conditions of plasma in the etching vary, the respective resistor elements suffer from the influence similarly, and variations in resistance ratio can be inhibited (FIG. 5B).

Figure 5C:
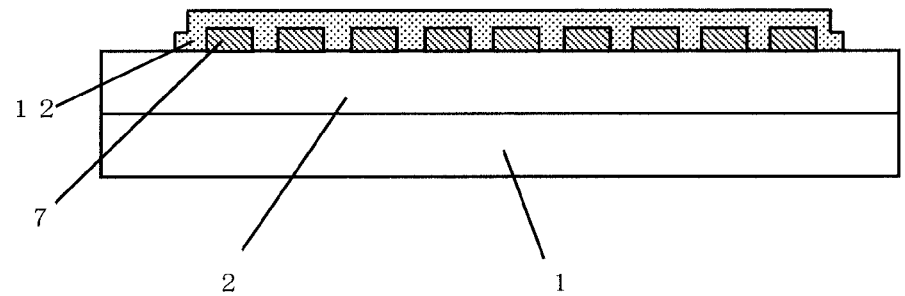

Then, the high stress insulating film 12, which is specific to the present invention and is a thin film having a stress higher than that of a metal film, for example, formed of Si3N4, SiC, SiON, or SiCN, is deposited as a single-layer film or a multilayer film on the semiconductor substrate including the resistor elements by an arbitrary method such as LPCVD or sputtering, and portions other than around the resistor elements are etched off (FIG. 5C). In this way, the high stress insulating film 12 extends continuously without interruption over all of the resistor elements and is brought into close contact with upper surfaces and side surfaces (but not surfaces on the semiconductor substrate side) of the resistor elements.

Then, although not illustrated, through another photomask process, the high concentration impurity regions 6 are formed by ion implantation in a part of polycrystalline silicon.

Figure 6A:
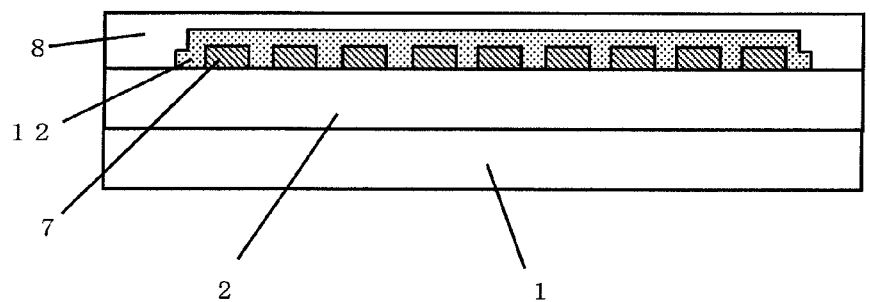
FIGS. 6A to 6C are sectional views subsequent to FIGS. 5A to 5C illustrating the process flow for manufacturing the resistor circuit according to the first embodiment of the present invention.

Then, the intermediate insulating film 8 is formed on the semiconductor substrate (FIG. 6A). The intermediate insulating film 8 is formed as follows. After an oxide film containing phosphorus or boron is deposited, reflowing for planarization by heat treatment at 850° C. or higher is started, followed by etching back or CMP for planarizing the deposited insulating film.

Then, although not illustrated, through a photomask process, contact holes that pierce the high stress insulating film 12 to reach the resistor elements are formed by dry etching at terminal portions of the resistor elements.

Figure 6B:
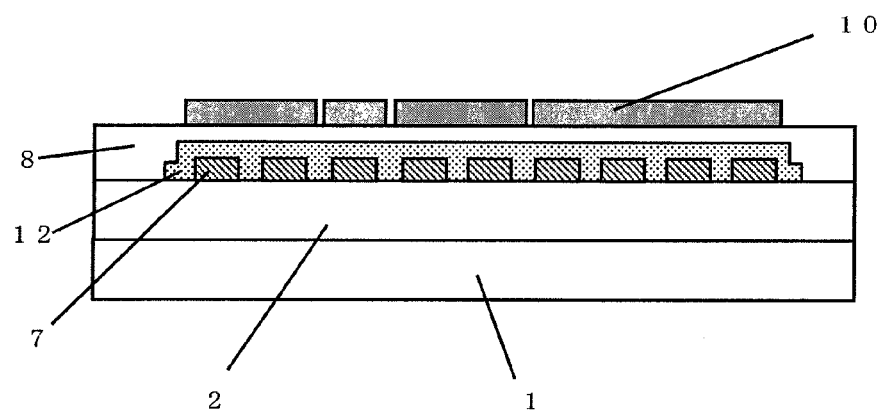

Then, the metal film is deposited. As the metal film, AlSi containing Al as a main component and also containing Si, AlCu or AlSiCu containing Cu, or the like is selected as necessary. Further, as necessary, a high-melting-point metal thin film such as a Ti-based film is formed as an underlayer of the metal thin film. After that, through a photomask process, the metal wirings 10 are formed (FIG. 6B).

Figure 6C:
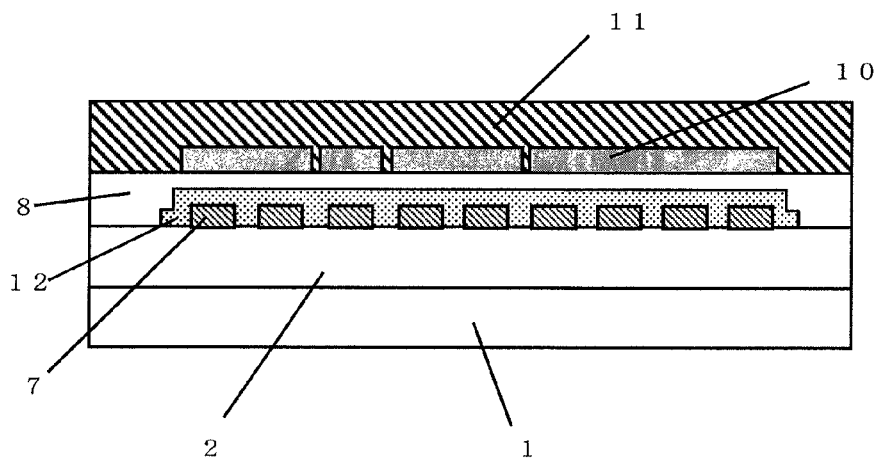

Finally, a passivation film 11 as a final protective film is deposited and patterned to complete the resistor circuit including the resistor elements according to the present invention (FIG. 6C).

Figure 4A:
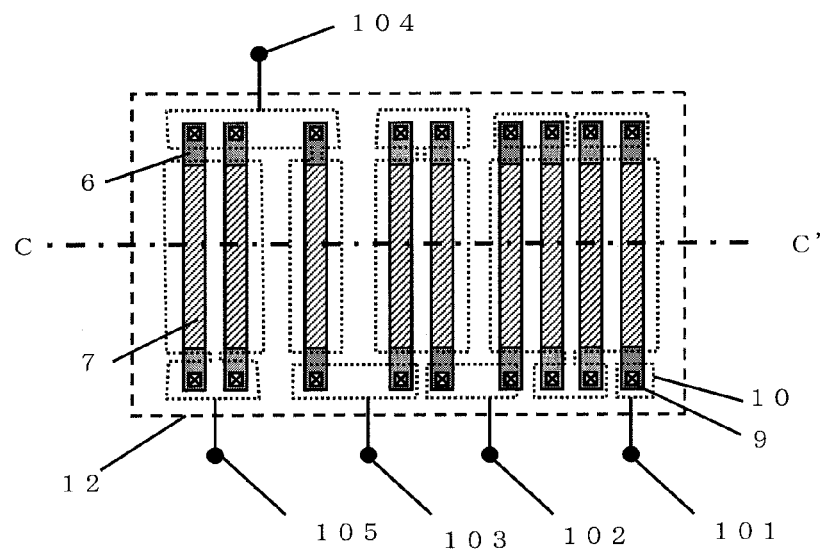
FIGS. 4A and 4B are a schematic plan view and a schematic sectional view illustrating a resistor circuit according to a second embodiment of the present invention.
Figure 4B:
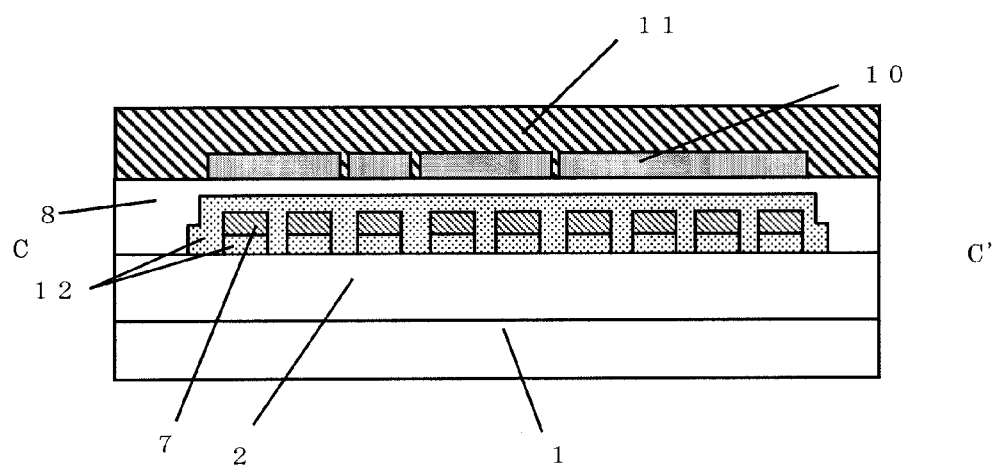

FIG. 4A is a plan view illustrating a resistor circuit in which resistor elements formed of polycrystalline silicon are two-dimensionally arranged according to another embodiment of the present invention, and FIG. 4B is a sectional view taken along the line C-C' of FIG. 4A.

Electrical connection among the resistor elements forming the resistor circuit is as illustrated in FIG. 3.

In the embodiment illustrated in FIGS. 4A and 4B, the insulating film 12 having a membrane stress that is higher than that of the metal wirings in the same shape as the resistor elements is formed between the flat thick oxide film 2 on the semiconductor substrate 1 and the polycrystalline silicon film forming the resistor elements. Further, similarly to the first embodiment, the insulating film 12 having a membrane stress that is higher than that of the metal wirings is formed on the resistor elements so as to cover the entire resistor elements. It is possible to form the high stress insulating film which covers the entire surfaces of the respective resistor elements, giving uniformity and stability to the stress between films at the entire surfaces of the resistor elements. In so doing not only influence of stress applied from the metal thin film but also influence of other stress applied from the outside can be inhibited, reducing variations in resistance due to the piezoresistance effect.

Further, compared with the case illustrated in FIGS. 1A and 1B, change in stress over and under the resistor elements due to temperature change can be inhibited to enhance reliability against physical change such as peeling and a crack due to stress difference between top surfaces and bottom surfaces of the resistor elements.

Next, a method of manufacturing the structure of the resistor circuit illustrated in FIGS. 4A and 4B according to the present invention is described with reference to FIG. 7A to FIG. 8E.

Figure 7A:
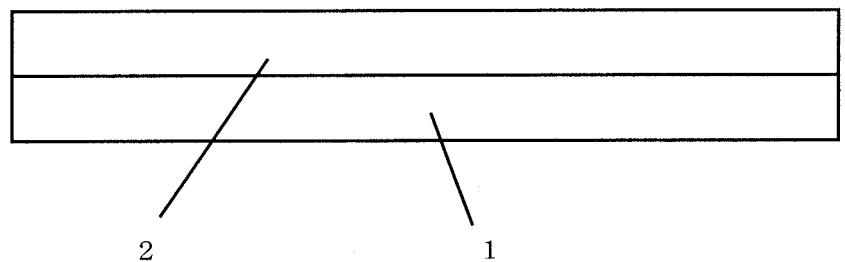
FIGS. 7A to 7C are sectional views illustrating a process flow for manufacturing the resistor circuit according to the second embodiment of the present invention.

Similarly to the case illustrated in FIGS. 1A and 1B, first, the semiconductor substrate 1 is prepared, and the insulating film 2 such as a thermal oxide film by LOCOS oxidation is formed on the semiconductor substrate 1 (FIG. 7A).

Figure 7B:
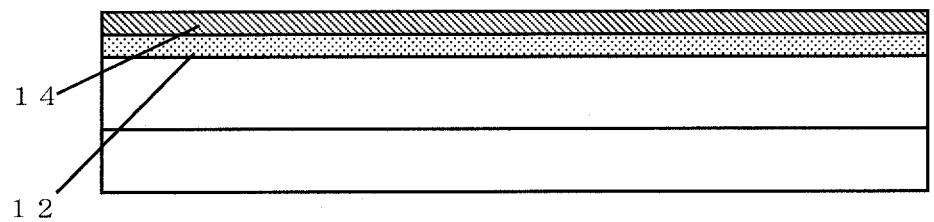

Then, the thin film 12, which is specific to the present invention, and which is a thin film having a stress higher than that of a metal film, for example, formed of $Si_3N_4$, SiC, SiON, or SiCN, is deposited by an arbitrary method. Then, a polycrystalline silicon film 14 to be the resistor elements is deposited, and after that, impurities for setting the resistivity of the resistor elements are implanted into the entire polycrystalline silicon film on the semiconductor substrate. The resistivity of the resistor element is adjusted by the amount of the implanted impurities. Similarly to the case described with reference to FIG. 5B, the kind and the amount of the implanted impurities are arbitrarily set as necessary (FIG. 7B).

Figure 7C:
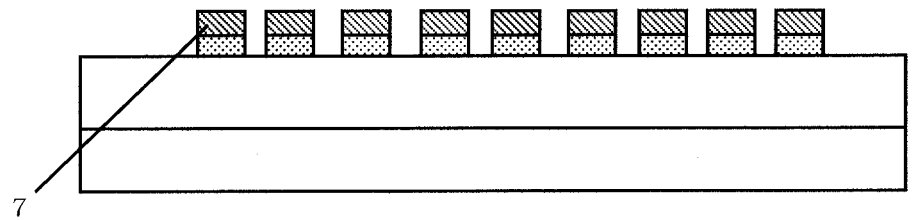

Then, the shape of the resistor elements 7 is processed and defined by dry etching or the like. At this time, the high stress insulating film under the resistor elements is simultaneously etched in a self-aligning manner (FIG. 7C).

Figure 8A:
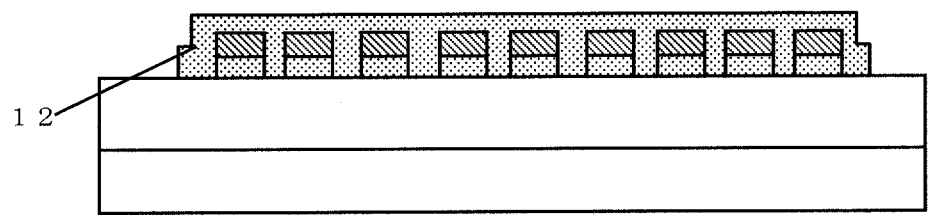
FIGS. 8A and 8B are sectional views subsequent to FIGS. 7A to 7C illustrating the process flow for manufacturing the resistor circuit according to the second embodiment of the present invention.

Then, the deposited thin film 12, which is specific to the present invention and is a thin film having a stress higher than that of a metal film, for example, formed of $Si_3N_4$, SiC, SiON, or SiCN, is deposited on the semiconductor substrate including the resistor elements by an arbitrary method, and portions other than around the resistor elements are etched out (FIG. 8A).

Then, although not illustrated, through another photomask process, the high concentration impurity regions 6 are formed by ion implantation in polycrystalline silicon.

Figure 8B:
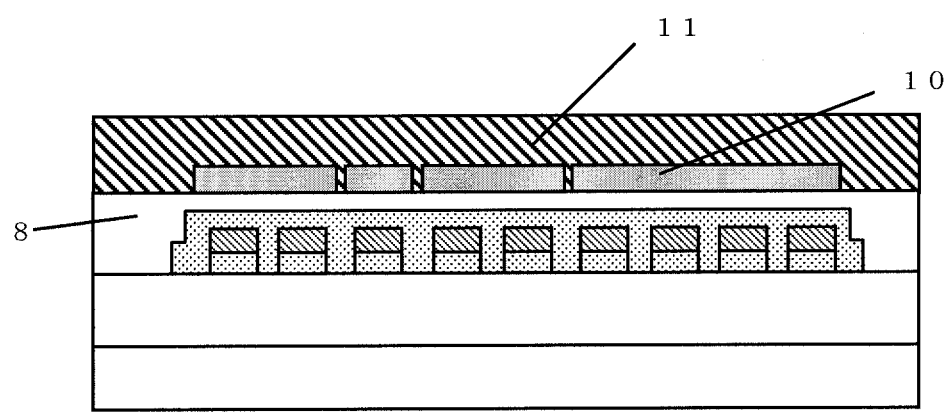

Then, although detailed description is omitted here, similarly to manufacture of a general semiconductor, the intermediate insulating film 8, the contact holes, and the metal wirings 10 are formed, and then, by depositing and patterning the passivation film 11 as a final protective film, the resistor circuit including the resistor elements according to the present invention is completed (FIG. 8B).

Note that, the film forming the resistor elements according to the present invention is not limited to a polycrystalline silicon film, and it goes without saying that other semiconductor-based thin films and thin film metal resistors may also be used.

What is claimed is:

1. A semiconductor device, comprising:
    a semiconductor substrate;
    a first insulating film of a silicon oxide film formed on the semiconductor substrate;
    a plurality of resistor elements of a polycrystalline silicon thin film formed on the first insulating film, the plurality of resistor elements being spaced from one another on the first insulating film and each of the plurality of resistor elements having a low concentration impurity region and a high concentration impurity region;
    a high stress insulating film formed on and covering the plurality of resistor elements and the first insulating film exposed between the resistor elements;
    a second insulating film covering a periphery of the high stress insulating film; and
    a plurality of metal wirings covering the low concentration impurity region of the plurality of resistor elements, one end of each of the plurality of metal wirings being electrically connected to one end of the plurality of resistor elements,
    wherein the high stress insulating film is formed in a region in which the plurality of resistor elements are arranged and which is larger than a region of the plurality of metal wirings, and the high stress insulating film has one of a compressive stress and a tensile stress that is higher than one of a compressive stress and a tensile stress of the each of the plurality of metal wirings.

2. A semiconductor device according to claim 1, further comprising a second high stress insulating film formed between the first insulating film and the plurality of resistor elements, the second high stress insulating film having one of a compressive stress and a tensile stress that is higher than the one of the compressive stress and the tensile stress of the each of the plurality of metal wirings.

3. A semiconductor device according to claim 1, wherein the high stress insulating film has one of a compressive stress of 500 MPa or more and a tensile stress of 500 MPa or more.

4. A semiconductor device according to claim 3, wherein the high stress insulating film comprises one of a single-layer film formed of any one of SiC, SiON, and SiCN and a multilayer film formed of a combination of different films.

5. A semiconductor device according to claim 3, wherein the high stress insulating film comprises a silicon nitride film formed by low pressure CVD.

6. A semiconductor device according to claim 5, wherein the high stress insulating film has a thickness of 0.15 μm or more.

7. A semiconductor device according to claim 1, wherein the plurality of resistor elements are arranged in resistor groups, each resistor group contains plural resistor elements, and the metal wirings corresponding to the respective resistor groups have different areas.

8. A semiconductor device according to claim 1, wherein the high stress insulating film is a single-layer film deposited on the plurality of resistor elements and on the first insulating film between the resistor element.

9. A semiconductor device according to claim 1, wherein the high stress insulating film is a multi-layer film deposited on the plurality of resistor elements and on the first insulating film between the resistor element.

10. A semiconductor device according to claim 1, wherein the high stress insulating film extends continuously without interruption over all of the resistor elements.

* * * * *